(12) United States Patent
Minamio

(10) Patent No.: US 7,755,030 B2
(45) Date of Patent: *Jul. 13, 2010

(54) OPTICAL DEVICE INCLUDING A WIRING HAVING A REENTRANT CAVITY

(75) Inventor: Masanori Minamio, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/240,635

(22) Filed: Sep. 29, 2008

(65) Prior Publication Data
US 2009/0032684 A1 Feb. 5, 2009

Related U.S. Application Data

(62) Division of application No. 10/958,296, filed on Oct. 6, 2004, now Pat. No. 7,485,848.

(30) Foreign Application Priority Data

Oct. 10, 2003 (JP) .............................. 2003-352090
Apr. 26, 2004 (JP) .............................. 2004-130300

(51) Int. Cl.
*H01J 40/14* (2006.01)

(52) U.S. Cl. ........................................ 250/239; 438/64

(58) Field of Classification Search .............. 250/214.1, 250/239; 438/64
See application file for complete search history.

(56) References Cited

U.S. PATENT DOCUMENTS

| 3,648,131 A | 3/1972 | Stuby |
| 5,506,401 A * | 4/1996 | Segawa et al. ............ 250/208.1 |
| 5,523,608 A | 6/1996 | Kitaoka et al. |
| 5,748,658 A | 5/1998 | Nakanishi et al. |
| 6,025,213 A | 2/2000 | Nemoto et al. |
| 6,291,274 B1 | 9/2001 | Oida et al. |
| 6,291,811 B1 | 9/2001 | Ogawa |

(Continued)

FOREIGN PATENT DOCUMENTS

| JP | 06-85222 | 3/1994 |
| JP | 08-107167 | 4/1996 |
| JP | 11-260996 | 9/1999 |
| JP | 2000-58805 | 2/2000 |
| JP | 2001-77277 | 3/2001 |
| JP | 2001-111159 | 4/2001 |
| JP | 2001-210754 | 8/2001 |
| JP | 2002-43554 | 2/2002 |
| JP | 2003-189195 | 7/2003 |

OTHER PUBLICATIONS

Japanese Office Action, with English Translation, issued in corresponding Japanese Patent Application No. JP 2004-130300, mailed on Nov. 27, 2007.

*Primary Examiner*—Georgia Y Epps
*Assistant Examiner*—Kevin Wyatt
(74) *Attorney, Agent, or Firm*—McDermott Will & Emery LLP

(57) ABSTRACT

An optical device includes a base and an optical element chip and translucent member attached to the base. A wiring is buried in the base. One end of the wiring is an internal terminal portion. The other end of the wiring is an external terminal portion. A semiconductor chip incorporating peripheral circuits, etc., and a metal wire for connecting a pad electrode of the semiconductor chip and the wiring are buried in the base. The semiconductor chip incorporating peripheral circuits, etc., and the metal wire are buried together with the wiring in the base by molding, whereby the optical device and the semiconductor chip incorporating peripheral circuits, etc., are integrated into a single package.

14 Claims, 6 Drawing Sheets

U.S. PATENT DOCUMENTS

| | | |
|---|---|---|
| 6,396,116 B1 | 5/2002 | Kelly et al. |
| 6,425,695 B1 | 7/2002 | Murata et al. |
| 6,590,152 B1 | 7/2003 | Horio et al. |
| 6,798,031 B2 | 9/2004 | Honda et al. |
| 2002/0153581 A1 | 10/2002 | Lin et al. |
| 2003/0071342 A1 | 4/2003 | Honda et al. |
| 2004/0012698 A1 | 1/2004 | Suda et al. |
| 2004/0084741 A1 | 5/2004 | Boon et al. |
| 2004/0140547 A1 | 7/2004 | Yamazaki et al. |
| 2004/0188790 A1 | 9/2004 | Arndt et al. |

* cited by examiner

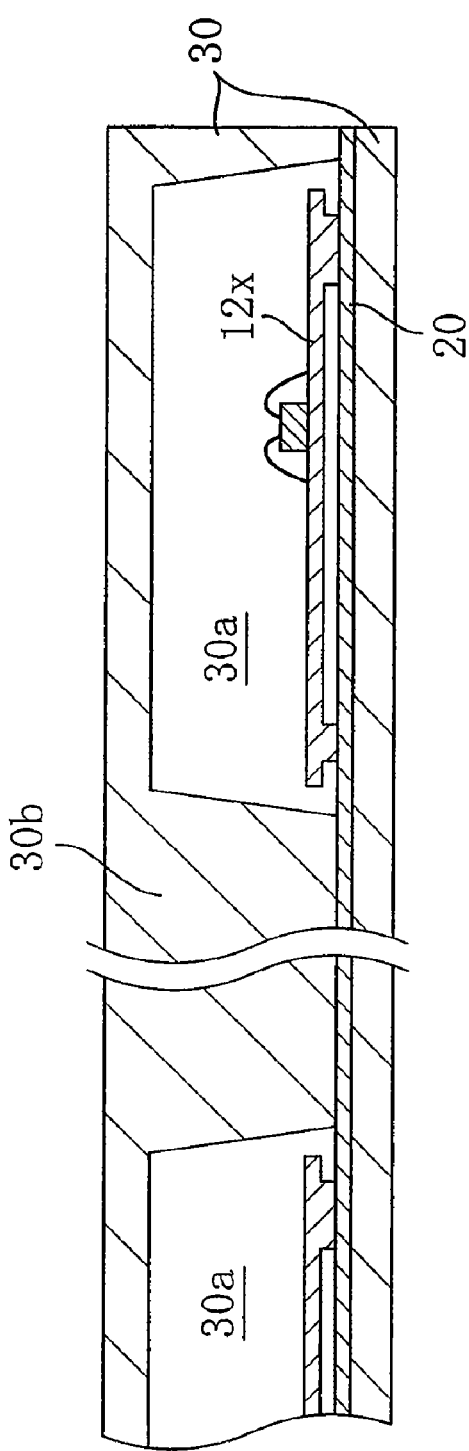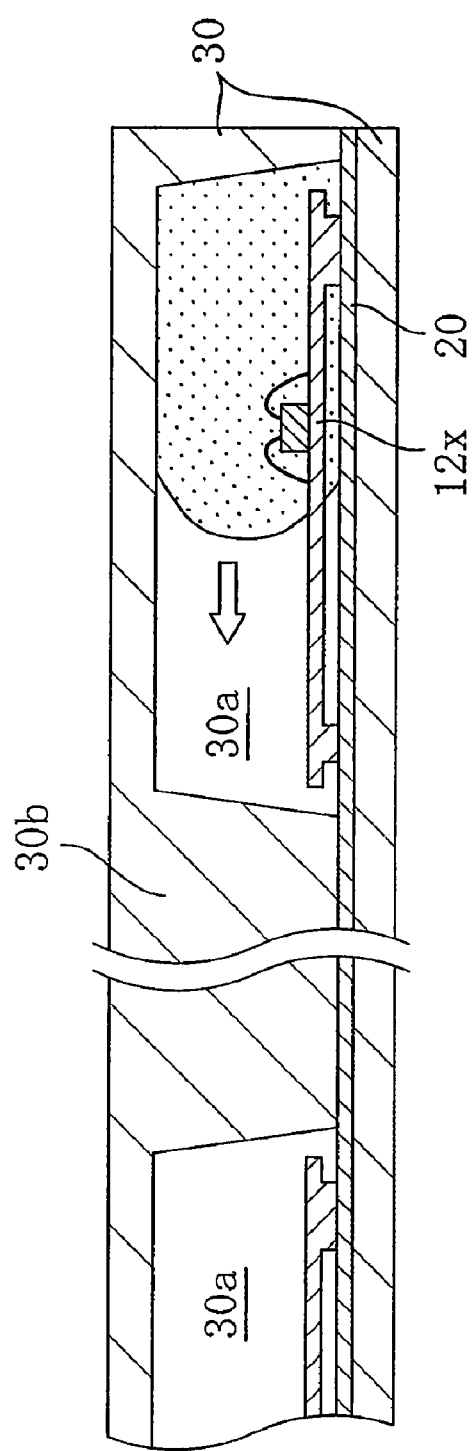

OPTICAL DEVICE INCLUDING A WIRING HAVING A REENTRANT CAVITY

CROSS-REFERENCE TO RELATED APPLICATIONS

This application is a Divisional of U.S. application Ser. No. 10/958,296 filed 10/06/2004, and now U.S. Pat No. 7485848, claims priority under 35 U.S.C. §119(a) on Japanese Patent Application No. 2003-352090 filed on Oct. 10, 2003 and Japanese Patent Application No. 2004-130300 filed on Apr. 26, 2004, the entire contents of which are hereby incorporated by reference.

BACKGROUND OF THE INVENTION

1. Field of the Invention

The present invention relates to an optical device, such as an optical device, a light receiving device for use in an optical pickup system, a hologram unit, or the like, and to a production method thereof.

2. Description of the Prior Art

In recent years, an optical device incorporated in video cameras, digital cameras, digital still cameras, and the like, has been provided as a package element wherein a light receiving region is covered with a translucent plate while an imaging device, such as a CCD, or the like, is mounted on an adapter, such as a base made of an insulating material, or the like.

For the purpose of decreasing the size of the optical device, the imaging device mounted on the adapter, such as a base, is in the form of a bear chip (see, for example, Japanese Unexamined Patent Publication No. 2000-58805).

FIG. 6 is a cross-sectional view of a conventional optical device. The optical device is mainly made of a ceramic material or plastic resin. Referring to FIG. 6, the optical device includes a base 131 which is in the form of a frame having an opening 132 in the central portion, an imaging element 135 attached to the lower surface of the base 131 which includes a CCD, etc., a translucent plate 136 made of glass attached onto the upper surface of the base 131 to face the imaging element 135 through the opening 132 provided therebetween.

On the lower surface of the base 131, a reentrant cavity 133 is formed in a region around the perimeter of the opening 132. A wiring 134 formed by a gold plated layer is provided to cover a region extending from a vicinity of the opening 132 at the lower surface of the base 131 to the outer perimeter side surface of the base 131 as shown in FIG. 6. An imaging element 135 is attached to the perimeter of the reentrant cavity 133 at the lower surface of the base 131 such that a light receiving region 135a is exposed to the opening 132.

Near the perimeter region of the upper surface of the imaging element 135, an electrode pad (not shown) is provided for transmitting a signal between the imaging element 135 and external devices. An internal terminal section is formed at an end of the wiring 134 adjacent to the opening 132. The internal terminal section of the wiring 134 and the electrode pad are electrically connected to each other with a bump (protruded electrode) 138 interposed therebetween. The imaging element 135, the wiring 134 and the bump 138 are sealed with a sealing resin 137 provided around the imaging element 135 at the lower surface of the base 131.

As described above, the light receiving region 135a of the imaging element 135 is provided in a closed space formed at the opening 132. This optical device is mounted on a circuit board while the translucent plate 136 is at the upper side of the device as shown in FIG. 6. An external terminal section is formed on the lower surface of the base 131 in a region of the wiring 134 which exists outside the area of the reentrant cavity 133. The external terminal section is used for connecting to an electrode on the circuit board.

Although not shown, a mirror tube incorporating an imaging optical system is provided above the translucent plate 136. As for the positional relationship between the mirror tube and the light receiving region 135a, the required accuracy is determined such that the relationship is within a predetermined tolerance.

Light which comes from an object to be imaged is focused on the light receiving region 135a of the imaging element 135 by the imaging optical system incorporated in the mirror tube. The focused light is photoelectrically converted by the imaging element 135.

An example of an optical device which has a structure different from that of the conventional base 131 shown in FIG. 6, e.g., a base having a generally flat shape wherein a reentrant cavity is not formed in the surface on which an imaging element is mounted, has been known (see, for example, Japanese Unexamined Patent Publication No. 2002-43554). In such a case, an external terminal section in an outer perimeter portion which is outside the perimeter of an opening of the base and an electrode on a circuit board are connected by a solder ball having a large diameter, or the like. The gap between the lower surface of the imaging element and the upper surface of the circuit board is adjusted by the solder ball.

A solid state imaging device having such a structure has a small package height, and the area occupied by such a solid state imaging device is small. Thus, this solid state imaging device is suitable for high density packaging.

The above-described structure is basically employed also in a light receiving device used in an optical pickup system which performs writing, reading and rewriting of information in/from a recording medium, such as DVDs, CDs, MDs, etc., and an optical device, such as a hologram unit in which a plurality of components of an optical pickup are integrated.

SUMMARY OF THE INVENTION

However, in the structure of the conventional optical device shown in FIG. 6, the density (intensiveness) of the entire system as a solid state imaging device, an optical pickup, or the like, is not sufficient. That is, there is some room for improvement.

An objective of the present invention is to provide an optical device of high packaging density which is achieved using a space for burying a wiring by molding, and a production method of such an optical device.

In order to achieve the above objective, a semiconductor chip and a connection member, such as a metal wire, or the like, are buried together with the wiring in a mold resin that constitutes a base to which an optical element chip and a translucent member are attached.

With the above structure, the optical device and the semiconductor chip incorporating peripheral circuits, etc., are integrated into a single package. Accordingly, an optical device of high packaging density is obtained. Furthermore, the size and cost of the entire system incorporating the optical device are decreased.

The thickness of the base may be substantially uniform. That is, the base has a flat-plate shape. Thus, high flatness is maintained in the surface to which the optical element chip is attached. Accordingly, the stability and accuracy in attachment of the optical element are improved.

Preferably, the semiconductor chip is mounted on the wiring.

An optical device production method of the present invention includes the step of forming a mold structure in which a lead frame having a wiring pattern, a semiconductor chip, a connection member for connecting the semiconductor chip and the lead frame are buried, the mold structure including a plurality of optical device formation regions, and each optical device formation region surrounding an opening.

With this method, the semiconductor chip is buried together with the wiring in the mold structure using a space in the mold resin.

Thus, in an optical device and production method thereof according to the present invention, a semiconductor chip and a connection member are buried together with a wiring in mold resin that constitutes a base for connecting an optical element chip, a translucent member, the wiring, etc., whereby the optical element chip and the semiconductor chip for peripheral circuits are integrated into a single package.

The optical device of the present invention can be used for a component of video cameras, digital cameras, digital still cameras, and the like, or an optical pickup used in a system for DVDs, CDs, MDs, etc.

BRIEF DESCRIPTION OF THE DRAWINGS

FIGS. 4A and 4B are cross-sectional views illustrating the molding process included in the process of producing the optical device of embodiment 1.

DESCRIPTION OF THE PREFERRED EMBODIMENTS

Embodiment 1

—Structure of Optical Device—

Figure 1A:
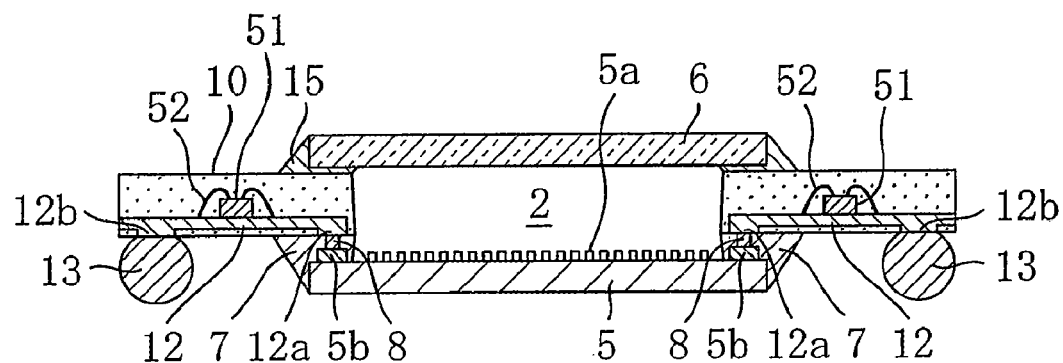
FIG. 1A is a cross-sectional view of the optical device taken along line IA-IA of FIG. 1B.
Figure 1B:
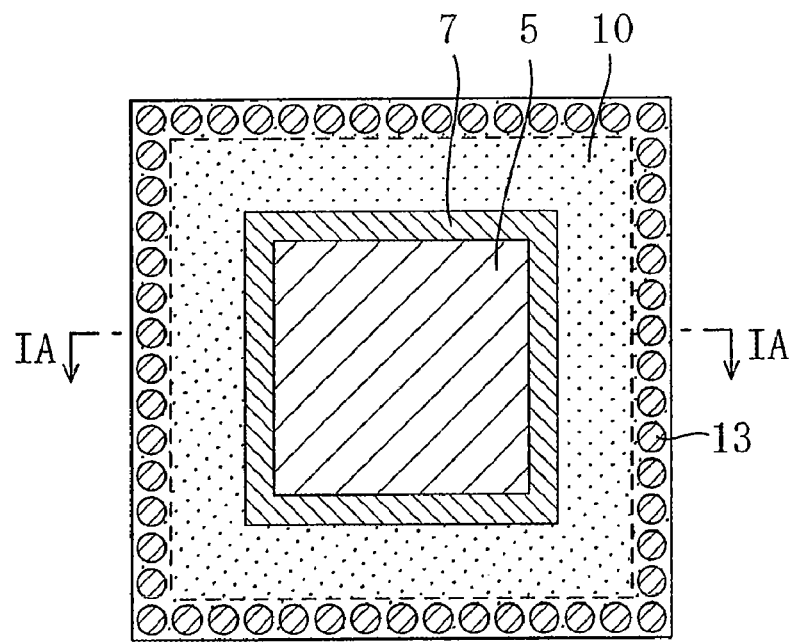
FIG. 1B shows a back surface of an optical device according to embodiment 1 of the present invention.

FIG. 1B shows a back surface of an optical device according to embodiment 1 of the present invention. FIG. 1A is a cross-sectional view of the optical device taken along line IA-IA of FIG. 1B. It should be noted that FIGS. 1A and 1B are drawn on different scales.

Referring to FIGS. 1A and 1B, the optical device of embodiment 1 includes a base 10 made of a plastic resin, such as epoxy resin, or the like, which is in the form of a frame having an opening 2 in the central portion, an optical element chip 5 attached to the lower surface of the base 10, a window member 6 formed by a translucent element made of glass attached onto the upper surface of the base 10 to face the optical element chip 5 through the opening 2 provided therebetween, and a solder balls 13. The base 10 connects the optical element chip 5 and the window member 6 of the optical device. This structure is called "premold structure" because it is formed by a procedure where the optical element chip 5 is mounted on the base 10 after the molding process.

In embodiment 1, the optical element chip 5 incorporates a solid state imaging element, such as a CCD, or the like. The optical device is a solid state imaging device for use in video cameras, digital cameras, digital still cameras, and the like.

It should be noted that the optical element chip 5 may incorporate a plurality of discretely-arranged light receiving elements in place of the solid state imaging element. In such a case, the optical device is a light receiving device provided in an optical pickup used in a system for DVDs, CDs, MDs, etc.

A wiring 12 is buried in the base 10. One end of the wiring 12 extends out of molded resin that constitutes the base 10 in a region near the opening 2 at the lower surface of the base 10, thereby forming an internal terminal portion 12a. The other end of the wiring 12 extends out of the molded resin that constitutes the base 10 in a perimeter region at the lower surface of the base 10, thereby forming an external terminal portion 12b.

Furthermore, a semiconductor chip 51 which incorporates a peripheral circuit of the optical element chip 5, and the like, and metal wires 52 for connecting a pad electrode of the semiconductor chip and the wiring 12 are buried in the base 10. Herein, an integrated circuit device incorporated in the semiconductor chip 51 is, for example, a driver circuit, a logic circuit, a front-end circuit, a peripheral circuit (e.g., a timing generator), a memory, or the like.

Figure 2:
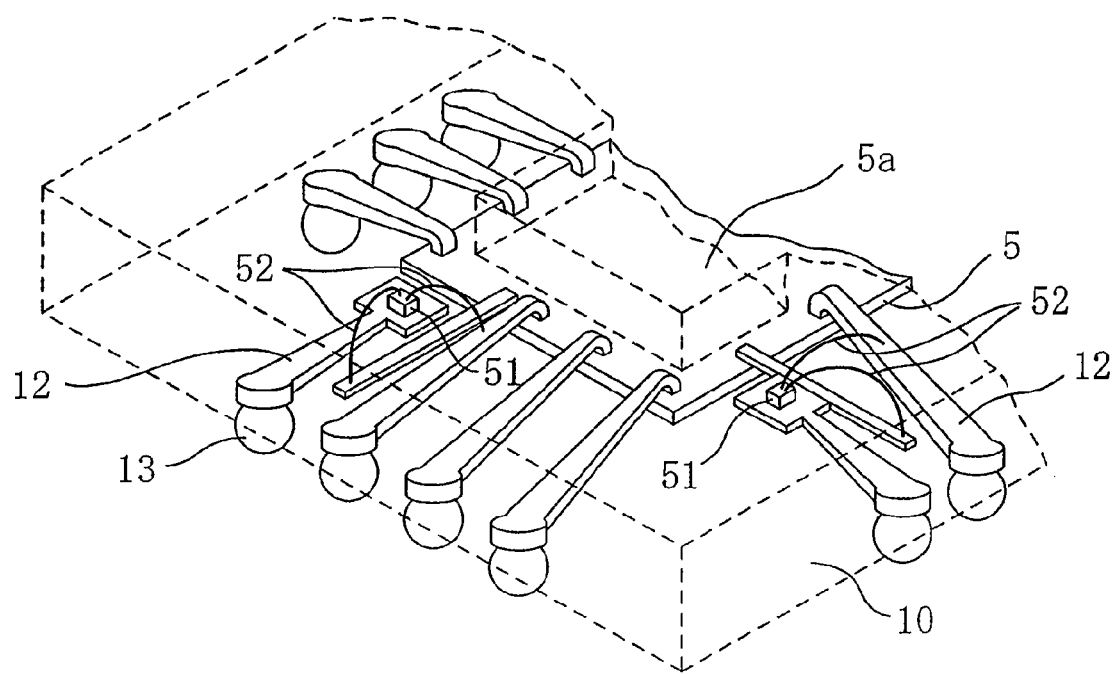
FIG. 2 is a perspective view of an exemplary structure of embodiment 1 wherein a semiconductor chip is buried in mold resin which forms a base.

FIG. 2 is a perspective view of an exemplary structure of embodiment 1 wherein the semiconductor chip 51 is buried in mold resin which forms a base. In FIG. 2, the mold resin is indicated by a broken line and shown as a transparent element. Referring to FIG. 2, for example, the semiconductor chip 51 is fixed onto a wiring 12 through an adhesive agent (not shown), and a pad electrode (not shown) of the semiconductor chip 51 and the wiring 12 are electrically connected by metal wires 52. The semiconductor chip does not need to be mounted on the wiring 12 but may be mounted on a supporting member connected to the optical element chip 5. Alternatively, in the production process which will be described later, the semiconductor chip may be fixed onto a sealing tape provided with an adhesive agent.

The optical element chip 5 is attached to the lower surface of the base 10 in a region surrounding the opening 2 such that the major surface 5a, which includes a light receiving region, is exposed to the opening 2. Near the perimeter region of the upper surface of the optical element chip 5, an electrode pad 5b is provided for transmitting a signal between the optical element chip 5 and external devices. The internal terminal section 12a of the wiring 12 and the electrode pad 5b are electrically connected to each other with a bump (protruded electrode) 8 interposed therebetween. That is, the internal terminal section 12a of the wiring 12 is connected to the electrode pad 5b of the optical element chip 5 through the bump 8. The optical element 5, the wiring 12 and the bump 8 are sealed with a sealing resin 7 provided around the optical element chip 5 at the lower surface of the base 10. On the other hand, on the upper surface of the base 10, the gap between the base 10 and the translucent member 6 is sealed with sealing resin 15 provided around the translucent member 6.

In embodiment 1, the thickness of the entire package element is, for example, equal to or smaller than 1.5 mm. The size of the semiconductor chip 51 is 0.5 to 5 mm in length, 0.5 to 5 mm in width, and 0.05 to 0.5 mm in thickness. The size of the optical element chip 5 is 1 to 10 mm in length, 1 to 10 mm in width, and 0.1 to 0.5 mm in thickness.

In the optical device of embodiment 1, the semiconductor chip 51 and connection members, such as the metal wires 52, etc., are buried together with the wiring 12 in the mold resin that forms the base 10, whereby the optical element chip 5 and the semiconductor chip (including peripheral circuits and the like) are integrated into a single package. Thus, an optical device of high packaging density is obtained. Further, the size of the entire system incorporating an optical device, such as a camera, or the like, and the production cost thereof are decreased.

Figure 6:
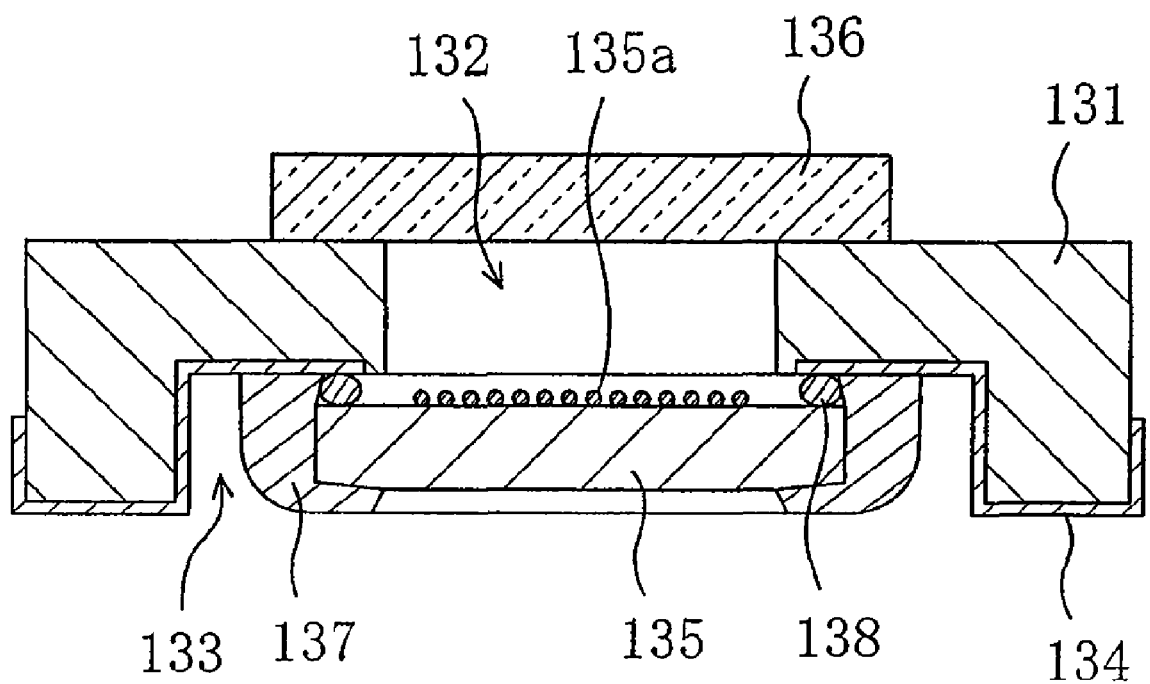
FIG. 6 is a cross-sectional view illustrating a structure of a conventional optical device.

Even with a structure where a semiconductor chip, metal wires, etc., are buried in the base 131 having a reentrant cavity as shown in FIG. 6 is used in place of the base 10 of embodiment 1, the effect of integrating the optical element chip 5 and the semiconductor chip (including peripheral circuits and the like) into a single package is achieved.

—Production Process of Optical Device—

FIGS. 3A to 3F are cross-sectional views illustrating the process of producing the optical device of embodiment 1. At the steps of FIGS. 3A to 3C, only two optical device formation regions are shown. However, in general, a lead frame having a large number of optical device formation regions arranged in a checkered pattern is used at the steps of FIGS. 3A to 3C.

FIGS. 4A and 4B are cross-sectional views illustrating the molding process included in the process of producing the optical device of embodiment 1.

Figure 3A:
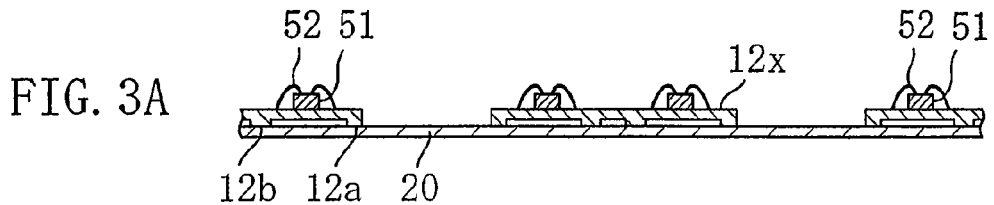
FIGS. 3A to 3F are cross-sectional views illustrating the process of producing the optical device of embodiment 1.

At the step of FIG. 3A, a lead frame 12x having a wiring pattern thereon is mounted on a sealing tape 20. The semiconductor chip 51, the metal wires 52, etc., are attached to a portion of the lead frame 12x which is to be a wiring as illustrated in FIG. 2. The lead frame 12x has a reentrant cavity formed over large part of the lower surface by half-etching or pressing, and only a portion which is to be the internal terminal section 12a or the external terminal section 12b protrudes downward from the bottom of the reentrant cavity.

Figure 3B:
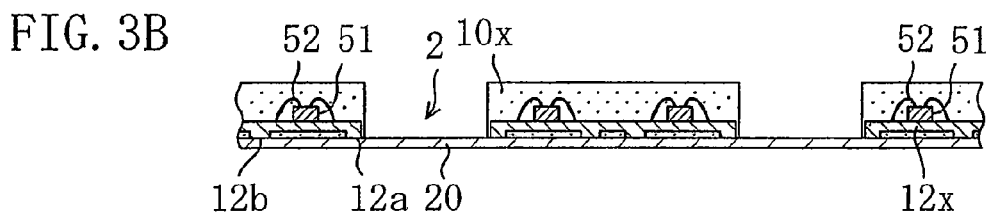

Then, molding is performed at the step of FIG. 3B. Specifically, as shown in FIGS. 4A and 4B, the lead frame 12x to which the sealing tape 20 is attached is placed in a metal mold 30, and a die cavity 30a of the metal mold 30 is filled with a plastic resin (mold resin), such as epoxy resin, or the like, whereby the lead frame 12x is buried in the mold resin except for the internal terminal section 12a and the external terminal section 12b to form a mold structure 10x. At this step, the semiconductor chip 51 and the metal wires 52 are also buried in the mold resin. A partition section 30b for separating the die cavities 30a of the metal molds 30 is not filled with the mold resin, and an opening 2 for attaching an optical element is formed at the central region of each optical device formation region in the mold structure 10x.

Figure 3C:
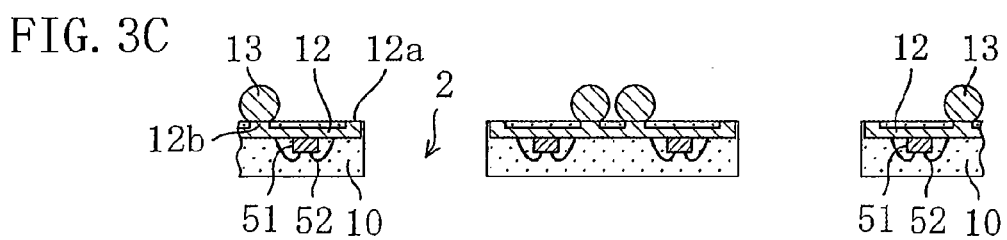

At the step of FIG. 3C, the sealing tape 20 is removed from the mold structure 10x, and the mold structure 10x is placed such that a surface on which the internal terminal section 12a and the external terminal section 12b are exposed faces upward. Solder balls 13 are formed on the external terminal section 12b.

Figure 3D:
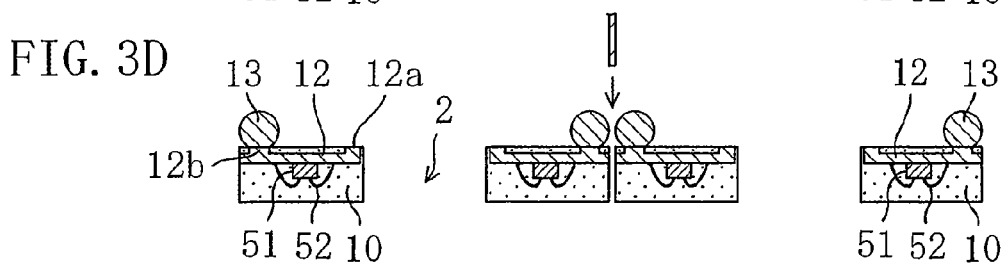

At the step of FIG. 3D, a blade is used to split the mold structure 10x at the border of the adjacent optical device formation regions of the mold structure 10x in the central region to form bases (separated parts) 10 for optical devices. At this step, the semiconductor chip 51 and the metal wires 52 are buried in the base 10 together with the wiring 12 having a large number of internal terminal sections 12a and external terminal sections 12b.

Figure 3E:
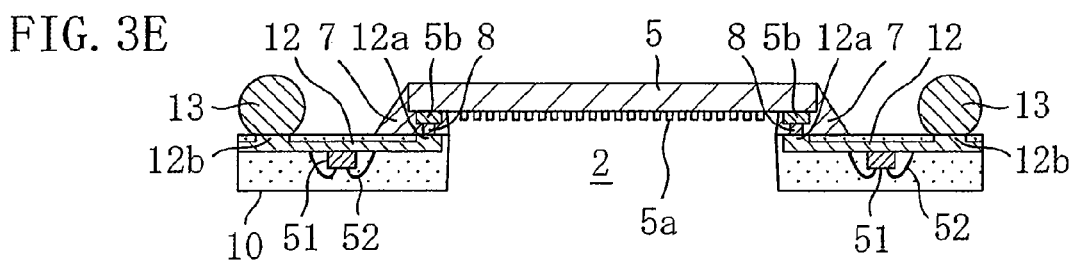

At the step of FIG. 3E, the optical element 5 is mounted on the base 10 such that the major surface 5a faces downward. A bump 8 is provided on the internal terminal section 12a of each base 10, and an electrode pad 5b of the optical element chip 5 is connected onto the bump 8. The gap in the connection section is filled with a sealing resin 7.

Figure 3F:
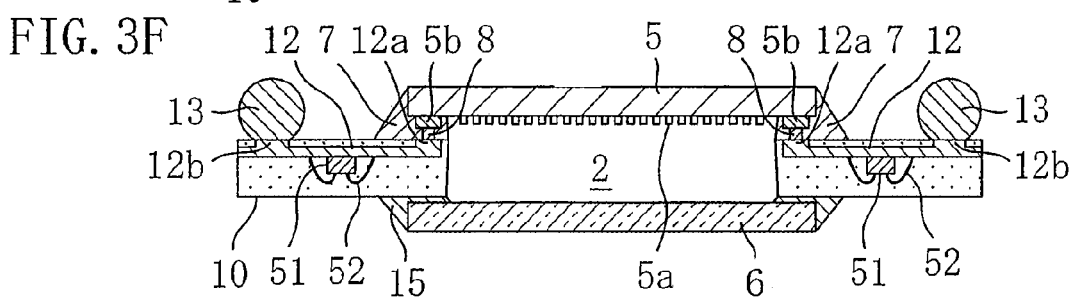

At the step of FIG. 3F, the base 10 is placed such that the surface (lower surface) of the base 10 on which the optical element chip 5 is mounted faces downward. A window member 6 made of glass is mounted on the upper surface of the base 10 to cover the opening 2. The gap between the window member 6 and the base 10 is filled with sealing resin 15 to seal the opening 2.

According to the production method of embodiment 1, at the step of FIG. 3A, the semiconductor chip 51 and the metal wires 52 are mounted on the lead frame 12x, and at the step of FIG. 3B, the semiconductor chip 51 and the metal wires 52 are buried in the mold resin together with the lead frame (wiring) 12x. With such a structure, an optical device of high packaging density is readily produced using a space in the mold resin.

The split step of FIG. 3D may be performed after the step of attaching the optical element chip in FIG. 3E or after the step of attaching the window member 6 in FIG. 3F.

Although the molding process is performed while the lead frame is placed on the sealing tape in the production processes of embodiment 1, it is not always necessary to use the sealing tape. However, in the case where the sealing tape is used, the upper and lower surfaces of the lead frame are clamped by the upper part and the lower part of the metal mold, whereby close contact is stably obtained between the surface of the metal mold and the upper and lower surfaces of the lead frame. As a result, generation of resin burr due to molding is effectively suppressed, and the external terminal section protrudes above the sealing resin. Accordingly, installation is readily and quickly achieved. For example, solder bonding is readily achieved in the process of attaching the optical device to a mother board.

Embodiment 2

Figure 5A:
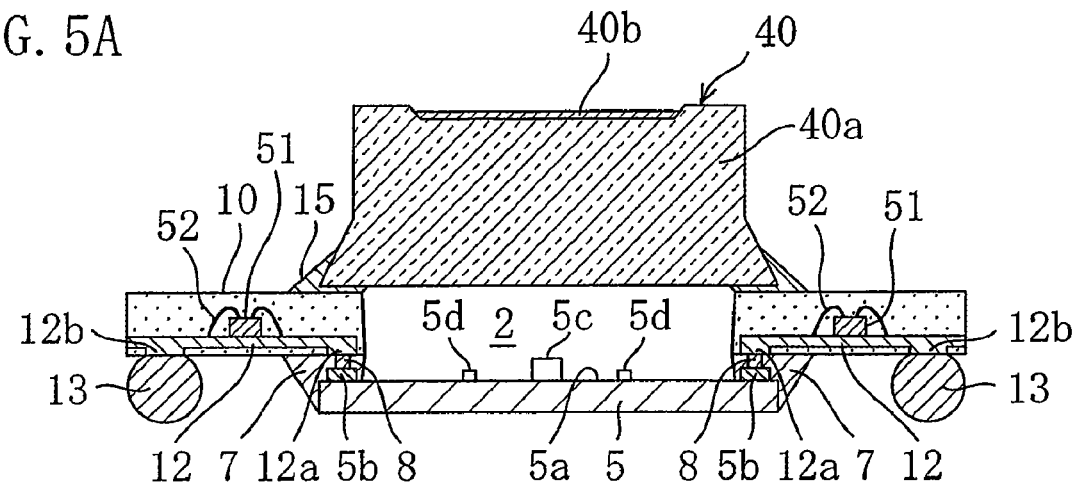
FIG. 5A is a cross-sectional view of the optical device taken along line VA-VA of FIG. 5B.
Figure 5B:
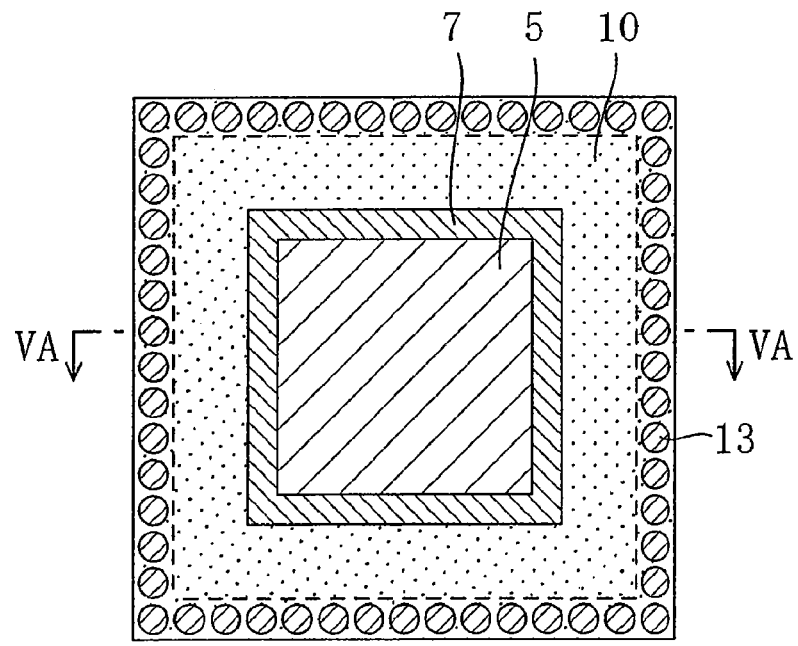
FIG. 5B shows a back surface of an optical device according to embodiment 2 of the present invention.

FIG. 5B shows a back surface of an optical device according to embodiment 2 of the present invention. FIG. 5A is a cross-sectional view of the optical device taken along line VA-VA of FIG. 1B. It should be noted that FIGS. 5A and 5B are drawn on different scales.

Referring to FIGS. 5A and 5B, the optical device of embodiment 2 includes a base 10 made of a plastic resin, such as epoxy resin, or the like, which is in the form of a frame having an opening 2 in the central portion, an optical element chip 5 attached to the lower surface of the base 10, a hologram 40 made of a resin for optics, or the like, which is attached onto the upper surface of the base 10 to face the optical element chip 5 through the opening 2 provided therebetween, and a solder balls 13. The base 10 is an adapter for connecting the optical element chip 5 and the hologram 40 of the optical device. This structure is called "premold structure" because it is formed by a procedure where the optical element chip is mounted on the base after the molding process. In embodiment 2, the optical element chip 5 includes a light emitting element 5c, such as a light emitting diode, or the like, and a light receiving element 5d. The optical device is a hologram unit which incorporates a plurality of components included in an optical pickup used in a system for DVDs, CDs, MDs, etc.

A wiring 12 is buried in the base 10. One end of the wiring 12 extends out of molded resin that constitutes the base 10 in a region near the opening 2 at the lower surface of the base 10, thereby forming an internal terminal portion 12a. The other end of the wiring 12 extends out of the molded resin that constitutes the base 10 in a perimeter region at the lower surface of the base 10, thereby forming an external terminal portion 12b.

Furthermore, a semiconductor chip 51 which incorporates a peripheral circuit of the optical element chip 5, and the like, and metal wires 52 for connecting a pad electrode of the semiconductor chip and the wiring 12 are buried in the base 10. Herein, an integrated circuit device incorporated in the semiconductor chip 51 is, for example, a driver circuit, a logic circuit, a front-end circuit, a peripheral circuit (e.g., a timing generator), a memory, or the like.

Also in embodiment 2, the semiconductor chip 51 is buried in molded resin that constitutes the base 10. This structure is basically the same as the structure of embodiment 1 shown in FIG. 2. Specifically, the semiconductor chip 51 is fixed onto a wiring 12 through an adhesive agent, and a pad electrode of the semiconductor chip 51 and the wiring 12 are electrically connected by metal wires 52. The semiconductor chip 51 does not need to be mounted on the wiring 12 but may be mounted on a supporting member connected to the optical element chip 5. Alternatively, in the production process which will be described later, the semiconductor chip 51 may be fixed onto a sealing tape provided with an adhesive agent.

The optical element chip 5 is attached to the lower surface of the base 10 in a region surrounding the opening 2 such that the major surface 5a, on which the light emitting element 5c and the light receiving element 5d are provided, is exposed to the opening 2. Near the perimeter region of the upper surface of the optical element chip 5, an electrode pad 5b is provided for transmitting a signal between the light emitting element 5c or light receiving element 5d of the optical element chip 5 and external devices. The internal terminal section 12a of the wiring 12 and the electrode pad 5b are electrically connected to each other with a bump (protruded electrode) 8 interposed therebetween. That is, the internal terminal section 12a of the wiring 12 is connected to the electrode pad 5b of the optical element chip 5 through the bump 8. The optical element 5, the wiring 12 and the bump 8 are sealed with a sealing resin 7 provided around the optical element chip 5 at the lower surface of the base 10.

The hologram 40 has a principal portion 40a made of a translucent material, such as a resin for optics, or the like, and a hologram region 40b provided over the upper surface of the principal portion 40a. The hologram 40 is fixed to an upper end portion of the base 10 by an adhesive agent 15 at an outer perimeter portion and lower surface of the principal portion 40a. The gap between the hologram 40 and the base 10 is filled with the adhesive agent 15 to seal an internal space 2, whereby a package element is obtained.

The height of the hologram 40 is, for example, in the range of 0.5 to 10 mm. The thickness of the entire package element is, for example, equal to or smaller than 1.5 mm. The size of the semiconductor chip 51 is the same as that of embodiment 1. The size of the optical element chip 5 is 1 to 10 mm in length, 1 to 10 mm in width, and 0.1 to 1.0 mm in thickness.

In the optical device of embodiment 2, the semiconductor chip 51 and connection members, such as the metal wires 52, etc., are buried together with the wiring 12 in the mold resin that forms the base 10, whereby the optical element chip 5 and the semiconductor chip (including peripheral circuits and the like) are integrated together with the hologram 40 into a single package. Thus, a hologram unit of high packaging density is obtained. Further, the size of the entire optical pickup system incorporating the hologram unit and the production cost thereof are decreased.

Even with a structure where a semiconductor chip, metal wires, etc., are buried in the base 131 having a reentrant cavity as shown in FIG. 6 is used in place of the base 10 of embodiment 2, the effect of integrating the optical element chip and the semiconductor chip (including peripheral circuits and the like) into a single package is achieved.

What is claimed is:

1. An optical device, comprising:
   a base provided with an opening and made of a mold resin;
   a wiring buried in the mold resin so as to cover an upper surface and a lower surface of the wiring;
   a translucent member attached to an upper surface of the base;
   an optical element chip coupled to the lower surface of the base through a bump which connects an electrode pad disposed on the optical element chip to the wiring;
   a semiconductor chip buried in the base; and
   a connection member buried in the base, the connection member connecting the semiconductor chip and the wiring, wherein
   the wiring has a reentrant cavity at the lower surface,
   only portions protruding downward from the bottom of the reentrant cavity are exposed from the mold resin to be an internal terminal section and an external terminal section,
   the reentrant cavity is covered with the mold resin,
   the translucent member is a hologram,
   the optical element chip includes a light receiving element and a light emitting element, and
   the optical device is a hologram unit.

2. The optical device according to claim 1, wherein the semiconductor chip is mounted on the wiring.

3. The optical device according to claim 1, further comprising a solder ball formed on the external terminal section.

4. The optical device according to claim 1, further comprising a sealing resin filling with a gap between the lower surface of the base and an upper surface of the optical element chip.

5. The optical device according to claim 1, wherein the base has a thickness with a substantially flat-plate-shape.

6. The optical device according to claim 1, wherein the wiring is composed of a lead frame.

7. An optical device, comprising:
   a base made of a mold resin and provided with an opening which is a hole through the base;
   a plurality of wirings buried in the mold resin so as to cover upper surfaces and lower surfaces of the wirings;
   a translucent member attached to an upper surface of the base so that the translucent member covers the opening of the base;
   an optical element chip coupled to a lower surface of the base so that the optical element chip covers the opening of the base;
   a semiconductor chip buried in the base; and
   a connection member buried in the base, the connection member connecting the semiconductor chip and the wiring, wherein
   the wiring has a reentrant cavity at the lower surface,
   only portions protruding downward from the bottom of the reentrant cavity are exposed from the mold resin to be an internal terminal section and an external terminal section,
   the reentrant cavity is covered with the mold resin,
   the translucent member is a hologram,
   the optical element chip includes a light receiving element and a light emitting element, and
   the optical device is a hologram unit.

8. The optical device according to claim 7, wherein:
an optical element chip is coupled to the lower surface of the base through a bump which connects an electrode pad disposed on the optical element chip to the internal terminal section of the wiring; and
the semiconductor chip is mounted on the wiring.

9. The optical device according to claim 7, further comprising a solder ball formed on the external terminal section.

10. The optical device according to claim 7, further comprising a sealing resin filling with a gap between the lower surface of the base and an upper surface of the optical element chip.

11. The optical device according to claim 7, wherein the base has a thickness with a substantially flat-plate-shape.

12. The optical device according to claim 7, wherein the wiring is composed of a lead frame.

13. The optical device according to claim 1, wherein the wiring includes a reduced thickness portion from which said portions protrude.

14. The optical device according to claim 7, wherein the wiring includes a reduced thickness portion from which said portions protrude.

* * * * *